SEMICONDUCTOR DEVICES AND METHODS OF MAKING SAME

Original Filed June 10, 1960 2 Sheets-Sheet 1

INVENTOR:
JOSEPH MOYSON,
BY Julius J. Jaskalicky
HIS ATTORNEY.

SEMICONDUCTOR DEVICES AND METHODS OF MAKING SAME

Original Filed June 10, 1960 2 Sheets-Sheet 2

INVENTOR:
JOSEPH MOYSON,

BY Julius J. Zaskalicky
HIS ATTORNEY.

United States Patent Office

Re. 27,120
Reissued Apr. 27, 1971

27,120
SEMICONDUCTOR DEVICES AND METHODS OF MAKING SAME

Joseph Moyson, Union Springs, N.Y., assignor to General Electric Company

Original No. 3,196,330, dated July 20, 1965, Ser. No. 35,336, June 10, 1960. Application for reissue Feb. 19, 1970, Ser. No. 12,696
Int. Cl. H01l *13/00, 9/12*
U.S. Cl. 317—235 11 Claims

Matter enclosed in heavy brackets [ ] appears in the original patent but forms no part of this reissue specification; matter printed in italics indicates the additions made by reissue.

*ABSTRACT OF THE DISCLOSURE*

*A multilayer semiconductor switching device is disclosed formed of a body of semiconductor material having a plurality of layers of opposite conductivity type which form P-N junctions therebetween. Electrodes are associated with opposite endmost layers. A low impedance path may be provided from one of the electrodes to an adjacent intermediate layer. A zone is provided in one of the intermediate layers adjacent an endmost layer, the zone having a conductivity type corresponding to that of the endmost layer, and a control electrode is associated with this zone.*

The present invention relates, in general, to semiconductor devices and, in particular, to improvements in semiconductor devices of the multi-layer type having switch-like characteristics.

Such devices are described in an article by Moll, Tanenbaum, Goldey and Holonyak in "Proceedings of the IRE," September 1956, volume 44, pages 1174–1182. One form of such currently available devices includes a pair of main current carrying electrodes and a control electrode. When connected in circuit, significant current conduction across the main electrodes is blocked until a small control current of suitable magnitude is applied to the control electrode. Such form of device is composed of a body of silicon semiconductor material having four distinct layers with adjacent layers being of opposite conductivity type to form a plurality of P–N junctions and having an electrical terminal connected to each of the outside layers. When one terminal is biased in one polarity with respect to the other terminal, the two P–N junctions nearest the terminals become reversely biased and the center P-N junction becomes forwardly biased; thus a high impedance is presented between the terminals. If a sufficiently large potential is applied between the terminals, the two P–N junctions nearest the terminals break down and conduct current in the reverse direction. When the one terminal is biased in the other polarity with respect to the other terminal, the two P-N junctions nearest the terminals become forwardly biased and the center P–N junction becomes reversely biased; thus a high impedance is again presented between the terminals. However, if the potential applied between the terminals is increased, or if control current of suitable magnitude and direction is applied to one of the intermediate layers, eventually not only does the center P–N junction break down, but reverses in polarization and a very low impedance is presented between the terminals.

Two requirements which must be fulfilled in order to obtain the reversal in polarity of the center P–N junction and hence conduction thereacross are (1) that one of the two transistor sections into which the device is resolvable, an NPN and a PNP transistor section with the center junction being the collector junction of each of the transistor sections, have a current gain, $\alpha$, which increases with current, and (2) that the sum of the current gains of the two transistor sections be equal to or greater than unity at some intermediate current. The variable current gain requirement is inherent in silicon P-N junction structures. Sufficient current is passed by the center junction as a result of leakage or avalanche effects to enable the second requirement to be met.

Desirable qualities in such devices are that they be relatively insensitive to ambient temperatures and heating in the device itself, particularly with respect to being able to withstand high temperatures without spontaneously triggering in the absence of a control current applied to the control electrode. Another desirable quality in such devices is that they have the capability of switching large currents in response to very small control current. In devices such as described above, these two requirements are normally contradictory. Normally, as the capability for switching larger currents is enhanced, larger control currents are required for this purpose. It would be particularly desirable to obtain control current sensitivity along with higher temperature stability. A series of devices are disclosed in a copending patent application, Serial Number 838,504, Richard W. Aldrich and Nick Hononyak, Jr., filed September 8, 1959, and assigned to the assignee of the present invention, in which better temperature stability is obtained. However, in some of the devices disclosed in that patent application, some control current sensitivity has to be sacrificed over the sensitivity of conventional devices.

The present invention is directed to the provision of switching devices of the kind described in which better control current sensitivity and better temperature stability are concurrently obtained as well as to the provision of novel devices.

Accordingly, it is an object of the present invention to provide semiconductor devices of improved characteristics.

It is another object of the present invention to provide novel means for controlling the conduction of multilayer switching devices.

It is still another object of the present invention to provide multi-layer switching devices of greater sensitivity.

It is a further object of the present invention to provide novel semiconductor devices of switch-type characteristics which are stable and relatively insensitive to temperature effects.

It is a further object of the present invention to provide novel multi-layer three-electrode switching devices of greater design flexibility and more versatility in circuit application.

In carrying out the present invention in one illustrative form thereof, a body of semiconductor material including four layers of one and the opposite conductivity type are provided. The layers of one conductivity type are interleaved with layers of the opposite conductivity type to form three P-N junctions therein. One electrode is provided making low resistance ohmic contact with a surface of an external layer of said body and exposed surface of an adjacent intermediate layer. Another electrode is provided making low resistance ohmic contact with a surface of the other external layer of said body. A third electrode is provided making minority carrier injecting contact with the aforementioned adjacent intermediate layer and cooperatively associated with innermost junction to provide transistor action therewith. The third electrode is cooperatively associated with the one electrode, thereby enabling the center P-N junction adjacent the third electrode to be rendered conductive with minimal applied control current; thus initiating a sequence of action by which the center P-N junction becomes conductive over its entire extent. The one electrode need not be connected to the intermediate layer in order for the above action to be obtained. Sufficient control current flow can be obtained between the third electrode and the one electrode by virtue of such effects as saturation current or zener breakdown.

Further objects and advantages of the present invention will be more clearly understood by reference to the following description taken in connection with the accompanying drawings and its scope will be apparent in the appended claims.

Figure 1:
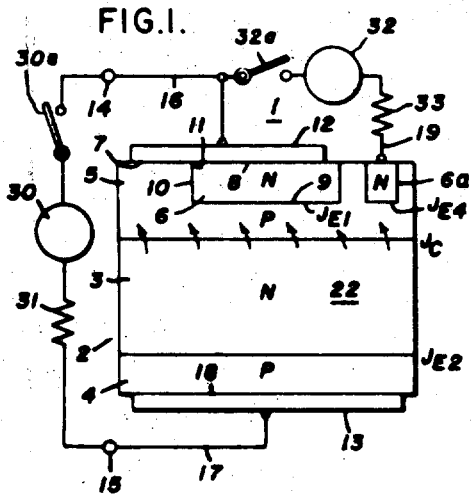
FIGURE 1 shows a sectional view of a four-layer three-electrode switching device in accordance with the present invention.

Referring now in particular to FIGURE 1, there is shown a cross-sectional view of an illustrative embodiment of the present invention. FIGURE 1 shows a semiconductor device 1 comprising a body of semiconductor material 2 having four layers or regions therein, an N-type conductivity intermediate region 3, a P-type conductivity external region 4, a P-type conductivity intermediate region 5 adjacent thereto, and an N-type conductivity external region 6 adjacent the P-type intermediate region 5. These regions meet to form three generally parallel P-N junctions, $J_C$, $JE_1$, and $JE_2$, $J_C$ is referred to as the collector or center junction and is formed between the N-type region 3 and the P-type region 5. $Je_1$ is referred to as the first emitter junction and is formed between the P-type layer 5 and the N-type layer 6. $JE_2$ is referred to as the second emitter junction and is formed between N-type layer 3 and P-type layer 4. The intermediate P-type region 5 surrounds the N-type region 6 on two sides and has a surface 7 coplanar with the outside surface 8 of region 6. Junction $JE_1$ has a substantial portion generally parallel to a surface 8 and a portion of lesser extent 10 generally perpendicular to and meeting with external surfaces 7 and 8 of regions 5 and 6, respectively. The body 2 has a pair of opposed surfaces generally parallel to the collector junction $J_C$. One opposed surface 18 comprises the external surface of the P-type region 4 and the other comprises the external surface 8 of the N-type region 6 and external surface 7 of intermediate P-type region 5 coplanar therewith. A conductive electrode 12 is secured in a good conductive contact with the external surfaces 7 and 8 and another conductive electrode 13 is secured in good conductive contact to the exernal surfaces 18. Elecrode 12 spans and short circuits junction $JE_1$ along a line whose projection perpendicular to the plane of the drawing is point 11. Electrodes 12 and 13 are connected to external terminals 14 and 15 by leads 16 and 17, respectively. A minority carrier injecting region 6a, a region of N-type conductivity, for example, is provided in the layer 5 which extends out to the top surface of the device on that side of the junction $JE_1$ which is remote from the part of $JE_1$ which is short circuited and forms $JE_4$ therewith. Electrode 19 is connected to region 6a.

Region 6a is of smaller extent than region 6 and forms with P-type regions 4 and 5 and N-type region 3 another four-layer three-electrode switching device with electrodes 12 and 13 being the external electrodes therefor. The region 6a may be differently formed than region 6, i.e. it may be more heavily N-type conductivity and it may be more closely spaced to $J_C$ than $JE_1$ and thus could be made appreciably more efficient as an emitter than region 6 and require only small triggering currents to render the device conductive between electrodes 12 and 13.

Figure 2:
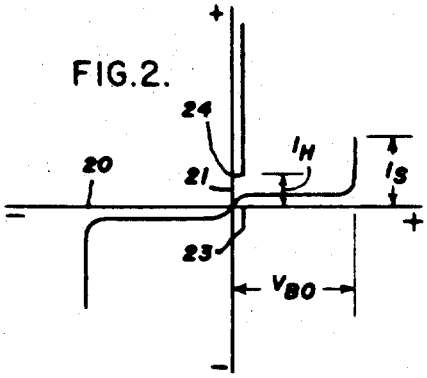
FIGURE 2 is a graph of the current versus voltage characteristics of the device of FIGURE 1.

The operation of the device of FIGURE 1 will be explained by reference to FIGURE 2 which shows a graph of the voltage versus current characteristics of the device of FIGURE 1. In the graph the current flow between the electrodes 12 and 13 is represented as the ordinate and the voltage applied across the electrodes is represented as the absicsa. Assume that an increasing voltage is applied between electrodes 12 and 13 by means of generator 30 and series current limiting resistor 31 connected through switch 30a between terminals 14 and 15, so as to render electrode 12 increasingly positive with respect to electrode 13. Junction $JE_1$ tends to become and $JE_2$ becomes reversely biased and thus blocks current flow thereacross. The collector junction $J_C$ is forwardly biased. Thus, a high impedance is presented across electrodes 12 and 13 until avalanche breakdown voltage of the emitter junction $JE_2$ is reached corresponding to voltage represented by abcissa 20 on the graph 2. Assume that an increasing voltage is applied between electrodes 12 and 13 to render electrode 12 increasingly negative with respect to electrode 13. With such voltage applied, junctions $JE_1$ and $JE_2$ become forward biased and junction $J_C$ becomes reversely biased. At low currents emitter junction $JE_1$ is practically inoperative as an emitter because of the shorting of the regions 5 and 6 by electrode 12. As the voltage across the device increases, only a small saturation current flows representing reverse current across junction $J_C$ shown as ordinate 21 on the graph of FIGURE 2. As the voltage approaches the avalanche voltage VBO of collector junction $J_C$, the current flow across junction $J_C$ represented by arrow 22 is parallel to the emitter junction $JE_1$ toward the surface 7 and increases rapidly. The resulting voltage drop produced by this current flow in region 5 along junction $JE_1$ toward biases $JE_1$ with the largest bias occurring at the right-hand edge of the junction farthest from the shorting contact 11. The effective emitter efficiency and hence alpha increases rapidly with increased current flow. When the current reaches a level $I_s$ referred to as turn-on current at which the alpha sum of the NPN and the PNP transistor sections of the device is greater than unity, the device switches to the low voltage state and to a voltage corresponding to abcissa 23 on the graph of FIGURE 2. The transistion is very abrupt for the reason that as the voltage across collector junction $J_C$ drops, the current originally distributed over the entire region 5 now shifts mainly to the edge of region 6 remote from portion 10 and the current density becomes very high. The device switches to the low voltage state at a still higher current level at which the alpha sum requirement is met. Once the switch is on, sufficient biasing of the base region 5 must still be maintained to hold the emitter in strong forward bias. Since $J_C$ is now in forward bias, avalanche effects of $J_C$ no longer are significant in maintaining conduction of the device. When external circuit requirements are such that the current $I_h$ in FIGURE 2 is less than the minimum value necessary to maintain the device in conduction as represented by ordinate 24, the device ceases to conduct and reverts to its non-conductive state. In the region of heavy forward conduction, most of the emitter is biased into conduction and the device exhibits the low impedance characteristic of conventional PNPN switch devices. With respect to the characterstics shown in FIGURE 2, it has been found possible to vary the value of the switch-on current $I_s$ to be greater than, equal to, or less than the hold current $I_h$, as explained in the aforementioned patent application.

Figure 3:
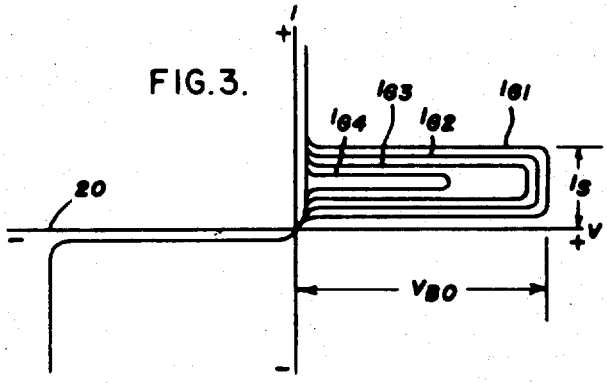
FIGURE 3 is an idealized graph of the current versus voltage characteristics of the device of FIGURE 1 showing the characteristics for various values of control current.

The manner of operation of junction gate or control region 6a will be explained with respect to the family of graphs in FIGURE 3. The family of graphs labelled $IG_1$, $IG_2$, $IG_3$, and $IG_4$ show the current versus voltage characteristics for increasing values of control current IG applied to electrode 19. The increased injection from region 6a into region 5 is obtained by appropriately negatively biasing electrode 19 with respect to electrode 12 by means of generator 32 and series current limiting resistance 33 connected through switch 32a between electrode 19 and 12 to permit layer 6a to function as an emitter. Increased bias across electrode 19 with respect to electrode 12 independently increases the injection into region 5, thereby raising the alpha of the NPN parts of the four-layer switch section of which it is a part, thereby permitting the alpha-increasing-with-current and the alpha-sum requirements referred to above to be met by this section of the device, thus causing the center junction to break down and reverse its polarity as explained above. This condition existing for the indicated small section of the device permits sufficient current to flow across $J_C$ to cause the main section of the four-layer device to break it down and conduct, thereby a low impedance is presented between the electrodes 12 and 13. It should be noted that the initiation of conduction over the control section of the device is independent of the temperature stabilizing effect of the shorted emitter structure. It has been mentioned above that the region 6a may be made very small and hence require only small injection currents to initiate the breakdown of the junction $J_C$. Also, the efficiency of region 6a as an emitter may be augmented and located very close to $J_C$ without effecting the reverse voltage breakdown characteristic of the device, but increasing the alpha of the NPN section, thereby increasing its sensitivity as well as the overall control sensitivity of the device.

The device shown in FIG. 1 may be constructed by any of a variety of techniques. In one such technique, a wafer of silicon semiconductor material of N-type conductivity having a resistivity of approximately 15 ohm-centimeters and 9 mils thick (a mil is one-thousandth of an inch) is placed in an evacuated sealed quartz tube with an alloy source consisting of silicon and gallium and back-filled with an inert gas. The temperature of the wafer is raised to about 1250° C. and the temperature of the alloy source is raised to 1050° C. Gallium from the source diffuses into the wafer to form regions corresponding to P-type reigon 4 and P-type region 5. The concentration of gallium in the alloy source and the time of diffusion is controlled so that the desired depths of penetration and resultant dimensions of the various layers are obtained. With the above gallium source at 1050° C. and the wafer temperature at 1250° C., diffusion time was approximately sixty hours. The wafer is then masked by suitable means such as an acid resistant wax in selected areas and thereafter etched with CP6 etch (by volume 5 parts 70% nitric acid, 3 parts 49% hydrofluoric acid, and 3 parts acetic acid) to form a circular pellet from the wafer having a diameter of one-half inch. The pellet is next boiled in trichloro-ethylene, then boiled in concentrated nitric acid (69%), and thereafter in sequence rinsed in hydrofluoric acid, deionized water and acetone. As a result of the aforementioned operations, the pellet has an N-type layer 3.6 mils thick sandwiched between two P-type layers 2.70 mils thick. A disc of aluminum of .495 inch in diameter and 2 mils thick and a tungsten back-up plate are placed, in that order, on one side of the pellet in a carbon fixture and two discrete discs of antimony-doped gold (99% gold-1% antimony), one having a diameter of 410 mils and 2 mils thick and the other having a diameter of 20 mils and 2 mils thick, are placed on the other side of the pellet in the fixture. The fixture with the pellet and discs lying flat are passed through a tunnel oven in a non-oxidizing atmosphere. The time and temperature of the oven are controlled to produce approximately one and one-half mils penetration of the gold antimony alloy. Thus a main emitter of N-type conductivity corresponding to region 6 and a control emitter of N-type conductivity corresponding to region 6a are formed in the pellet. Also, conductive contact is made to the region corresponding to region 4 by the aluminum disc and tungsten plate. Thereafter the sub-assembly having the gold-antimony alloy contacts is ground and lapped to remove the excess gold antimony and etched with CP6 etch. Aluminum is then deposited over the entire surface and selectively removed to form the electrode corresponding to the electrode 12 of FIG. 1. The assembly with a tungsten back plate with lead attached is passed through a tunnel oven to secure the tungsten plate of aluminum deposit to the assembly. The entire assembly is then etched in CP6 etch. A lead is then secured to region 6a by any suitable means such as thermo-compression bonding.

While the above example mentioned specific materials and structures, it will be appreciated that modifications could be made as desired. For example, the gold-antimony disc for the control electrode could be more heavily doped and include a greater thickness of material than the gold-antimony disc used for the main emitter, thus producing a heavier doped gate region and one that is closer to the collector junction. Further details in the fabrication of the device will be explained in connection with FIGS. 8 and 9.

Another technique for forming the device of FIG. 1 utilizing an all-diffused pellet is as follows. The starting material is essentially the same as in the previous process, an N-type silicon wafer having a resistivity of approximately 15 ohm-centimeters and 7 mils thick. Gallium is diffused into the wafer the same as in the previous example except the time of diffusion is approximately 17 hours, thereby producing a P-type region of about 2 mils thick. The wafer is then oxidized by subjecting it to wet oxygen at approximately 1240° C. for about five hours. The entire wafer is masked in some suitable way such as by coating with KPR (Kodak Photo Resist, a product of the Eastman Kodak Company, and well known in the art). The wafer is then covered with a glass mask having a desired pattern of light transmission thereon. Light is directed on the mask and exposes the photoresist according to the desired pattern. The unexposed area is thereafter etched with ammonium bi-fluoride to remove silicon oxide. The photoresist is then removed, leaving a PNP structure in which certain select areas have an oxide coating thereon. Phosphorus is next diffused into the structure where it is now masked by oxide in open tube diffusion in which the wafer is maintained at 1250° C. and the phosphorus source of $P_2O_5$ at 200° C. for ten minutes to form a deposit of phosphorus thereon. Heat is removed from the source and the wafer is maintained at 1250° C. for six hours. The wafer is then etched in hydrofluoric acid for two minutes to remove any oxide remaining on the wafer and then is cleaned by the ionized water rinse and acetone drying steps mentioned above. Aluminum is then vapor-deposited on both sides of the water. Select areas of the wafer are next covered with an acid resistant mask such apiezon wax and then etched in CP6 etch to pelletize the wafer as well as to remove aluminum shorts from undesired region of the individual pellet. Tungsten back-up plates are placed on both sides of the pellet in contact with the aluminum deposits and the sub-assembly is passed through a tunnel oven maintained at approximately 700° C. for several minutes to secure the electrodes thereto. In other respects the connection of electrodes to to the devices is the same as in the previous example and will be more fully discussed in connection with FIGS. 8 and 9.

Figure 4:
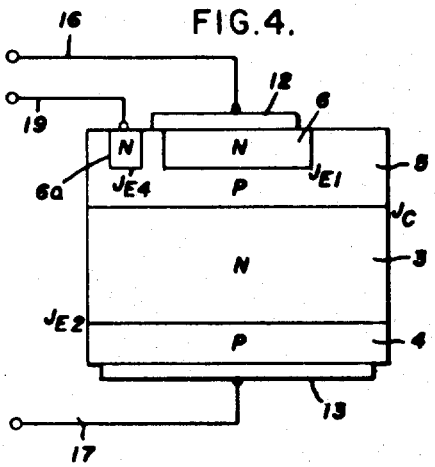
FIGURE 4 shows a sectional view of another embodiment of a four-layer three-electrode switching device in accordance with the present invention.
Figure 5:
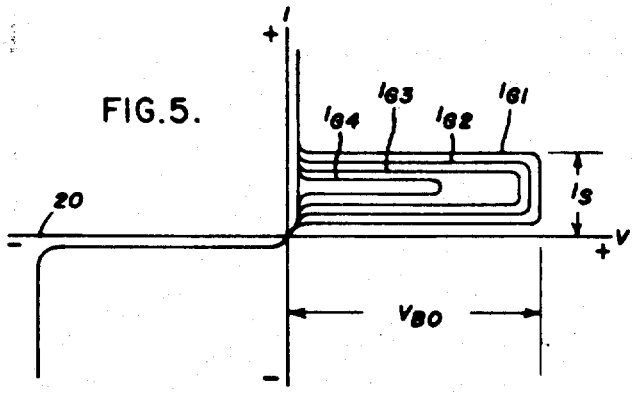
FIGURE 5 shows an idealized graph of the current versus voltage characteristic of the device of FIGURE 4.
Figure 6:
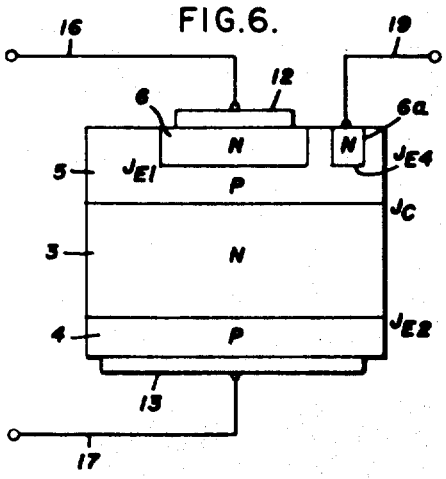
FIGURE 6 shows a sectional view of still another embodiment of a four-layer three-electrode switching device in accordance with the present invention.

In FIG. 4 is shown a four-layer three-electrode switching device similar to the device of FIG. 6 and corresponding elements ae denoted by the same designations. However, in this device a control electrode and the control region are placed adjacent to the region where electrode 12 makes contact with region 5. This device may be fabricated in accordance with the techniques of fabrication described above in connection with the device of FIG. 1. The operation is essentially the same as the operation of the device of FIG. 1. The voltage versus current characteristics of the device of FIGURE 4 are shown in FIGURE 5 for various values of control current $I_G$.

Figure 7:
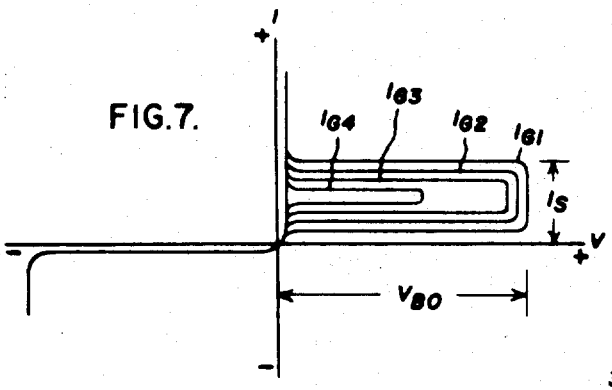
FIGURE 7 shows an idealized graph of the current versus voltage characteristic of the device of FIGURE 6.

In FIGURRE 6 is show another four-layer three-electrode switching device in accordance with the present invention. Corresponding elements are denoted by the same designations. In this embodiment electrode 12 does not make ohmic non-rectifying contact with region 5. The necessary electrical contact to the region 5 for proper functioning of the gate electrode 19 is accomplished in one or more of several ways. The efficiency as an emitter of parts of region 6 near the surfaces adjacent the junction $JT_1$ may be degraded by virtue of heavy concentration of impurities in the surface regions adjacent junction $JE_1$, thereby providing leakage current to the P-type region 5. the necessary conductive path to region 5 may also be supplied by inverse saturation current and zener current effects. The voltage versus current characteristics of the device of FIGURE 6 are shown in FIGURE 7 for various values of control current $I_G$.

The device of FIGURE 6 may be fabricated by techniques similar to the fabrication of the device of FIGURE 1, appropriate allowance, of course, being made for the different resistivities desired in the various regions thereof to obtain the mode of operation desired.

Figure 8:
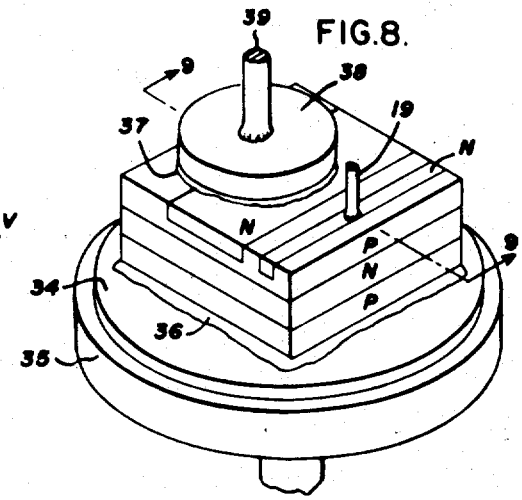
FIGURE 8 shows a perspective view of one structural form which the device of FIGURE 1 may take.
Figure 9:
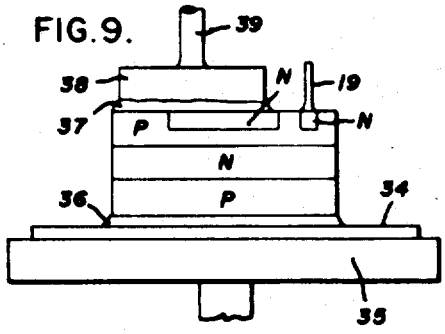
FIGURE 9 is a sectional view along section 9—9 of the device of FIGURE 8.
Figure 10:
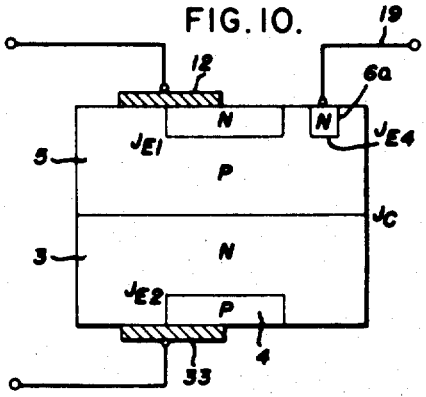
FIGURE 10 shows a sectional view of a further embodiment of a three-electrode four-layer switch-like device in accordance with the present invention.

FIGURES 8 and 9 show further constructional featuers of the device of FIGURE 10. Body 2 is shown mounted on a conductive plate 35 which may be tungsten as described above or other suitable material which in turn is soldered to mounting conductor 35. As mentioned above, the body 2 may be conductively secured to the tungsten plate by a deposit of aluminum 36 appropriately applied to the body 2 and soldered to the plate 35. Similarly, conductor 38 may be tungsten or other suitable material to which external conductor 39 is soldered and the manner of contact may be through a deposit of aluminum 37, as pointed out above, appropriately applied to the body and conductively secured to the tungsten plate. Control conductor 19 may be a wire either soldered to a gold-antimony (Au-Sb) deposit on the N-region or secured thereto by thermo-compression bonding. The constructional features shown in FIGURES 8 and 9 may be utilized in the other embodiments described above and to be described in the remainder of this specification.

In FIGURE 10 is shown a four-layer multi-electrode switch-type device. The device is similar to the device of FIGURE 1 and corresponding elements are denoted by the same designations. In this device, intermediate layer 5 extends out to the surface of the device on both sides of N-type region 6. Similarly, intermediate layer 3 extends out on the bottom of the surface of the device on both sides of the P-type region 4. Shorting contacts 12 and 33 are applied as in FIGURT 1. In addition, control region 6a of N-type cnductivity in rectifying contact with region 5 is formed therein on that side remote from the short. The device of FIGURE 7 may be fabricated in a manner similar to the manner of fabrication of the device of FIGURE 1.

Figure 11:
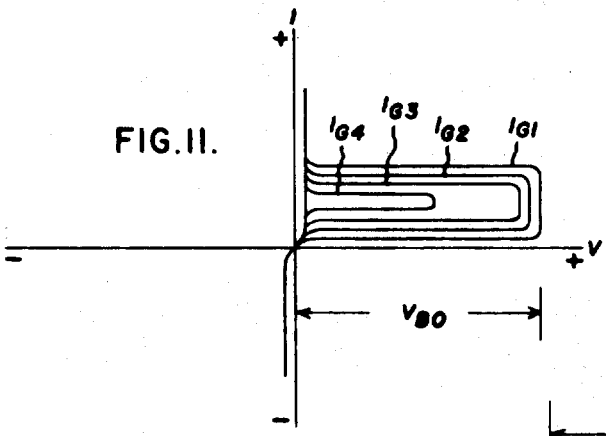
FIGURE 11 shows an idealized graph of the current versus voltage characteristics of the device of FIGURE 10.

In FIGURE 11 are shown the voltage versus current characteristics of the device of FIGURE 7. When electrode 12 is positive with respect to electrode 13, the junction $J_C$ becomes forward biased as shown in the third quadrant of the graph of FIGURE 11. When electrode 12 is negatively biased with respect to electrode 13, the forward characteristics are as shown in the family of graphs in the first quadrant. These graphs show the current versus voltage characteristics for various values of $IG_1$, $IG_5$ applied at electrode 19.

Figure 12:
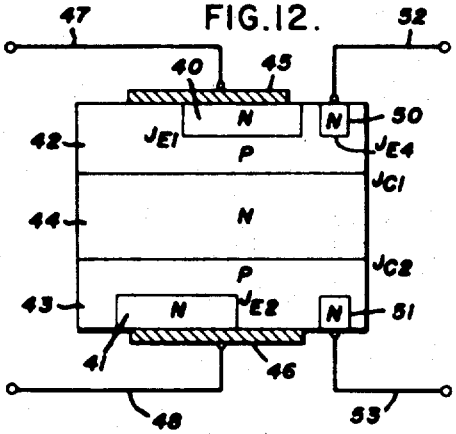
FIGURE 12 shows a sectional view of a multi-electrode five-layer switch device in accordance with the present invention.

In FIGURE 12 is shown a five-layer multi-electrode type switch device having control electrodes connected to various intermediate layers of the device. This figure shows a cross-sectional view of a switching device having the voltage versus current characteristics depicted in FIGURE 13. This device has five layers, 40, 41, 42, 43, and 44, each layer being of a conductivity type opposite to the conductivity type of an adjacent layer. Thus there are formed in the device four P–N junctions $JE_1$, $JE_2$, $J_{C1}$, $J_{C2}$. $JE_1$ is formed between N and P layers 40 and 42, respectively. $J_{C1}$ is formed between P and N layers 42 and 44, respectively. $J_{C2}$ is formed between P and N layers 43 and 44, respectively. The end layers 40 and 41 are of the same conductivity type, N-type, and foreshortened in width with the adjacent intermediate layers 42 and 43, presenting extended surfaces lying in the same plant as the external surfaces of layers 40 and 41. Electrodes 45 and 46 make conductive contact with the external surfaces of the semiconductor body from which the device is formed. Leads 47 and 48 are connected to electrodes 45 and 46. In the regions 42 and 43 N-type conductivity regions 50 and 51, respectively, are formed to which electrodes 52 and 53, respectively, are connected. It will be appreciated that the structure shown in FIGURE 12 can be fabricated by techniques similar to the techniques for fabrication of the device of FIGURE 1.

Figure 13:
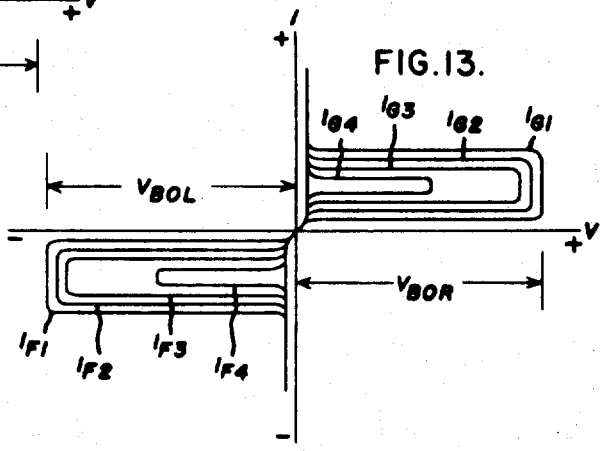
FIGURE 13 shows an idealized graph of the current versus voltage characteristic of the device of FIGURE 12.

In FIGURE 13 is shown an idealized graph of the current versus voltage characteristics of the device of FIGURE 12. The device of FIGURE 12 is characterized as a five-region symmetrical switch having two shorted emitters which switches either polarity of voltage applied across its terminals. The operation of the device of FIGURE 12 will be explained in conjunction with the graph of FIGURE 13. Assume that the voltage applied to electrode 45 is negative with respect to the voltage applied to 46. Junction $J_{E1}$ acts as an operative shorted emitter. Junction $J_{C1}$ acts as a collector, that is, the collector which is to switch. Junction $J_{C2}$ acts as the other emitter and junction $J_{E2}$ would tend to be in the reverse bias but because of the short circuit due to electrode 46, cannot sustain any voltage. The device in the assumed polarity switches just as does the device of FIGURE 1 and has the characteristic shown in the first quadrant of the graph. If now the applied voltage is reversed in polarity, it is obvious from the symmerty of this structure that again switching occurs and has the characteristic shown in the third quadrant of the figure. In a conventional NPNPN or PNPNP two-electrode device, switching also occurs but one or the other emitter junction is reversely biased so as to pass current only at the avalanche voltage of the junction. When electrode 45 is polarized negatively with respect to electrode 46, the device will become conductive at a particular value of voltage $V_{BOR}$ and, similarly, when electrode 45 is positively polarized with respect to electrode 46, the device will become conductive at another particular value of voltage $V_{BOL}$ as shown in FIGURE 21. The family of graphs $I_{G1}$–$I_{G5}$ and $I_{F1}$–$I_{F5}$ show the variation of the current versus voltage characteristic across electrodes 45, 46 of the device for various values of control current applied at control zones 50 and 51, respectively. For increasing values of control current, the devices switches to the forward conduction condition at lower values of voltage applied between electrodes 45 and 46.

As mentioned previously, the criteria for breakdown in forward conduction of the junction $J_{C1}$ in one case,, and $J_{C2}$ in the other case, is that the current gain of at least one of the two transistor sections into which the device is resolvable in the forward conduction condition have an alpha which increases with current and also that the sum of the alphas of the two-transistor sections at some intermediate current be equal to or greater than unity. These conditions for firing for a particular voltage applied across the main current carrying electrodes 45 and 46 can be fulfilled by the application of suitable currents to N-type conductivity zones 50 and 51. Of course, a signal on one of the control electrodes 60 and 61 would have an effect only when the main electrodes 45 and 46 are appropriately polarized. Of course the switching of the device to the conductive state can also be accomplished by simultaneous application of control currents to two of the control electrodes 50 and 51.

The device of FIGURE 12 may be used in circuits where conventional four-layer three-electrode control devices, commonly referred to as controlled rectifiers, are used as well as in other circuits which make full utilization of the bi-directional switching characteristics of the device as well as the multiplicity of control elements.

Typical devices of the above-described types have been made passing currents of greater than fifty amperes in forward direction with forward voltage drop being less than two volts and breakdown voltage between main current carrying electrodes being greater than 400 volts. Such devices were stable with temperatures upwards of 165° C. A typical value for control or gating current for such devices was 200 micro-amperes.

The devices disclosed above may be used in circuits in which the conventional controlled rectifiers are used, of course, appropriate allowance being made for difference in the modes of operation. While the various devices have in large part been shown as fabricated by diffusion techniques, it will be understood that other techniques and combination of techniques may be used to form the structures described.

While the invention has been shown and described in connection with particular embodiments of the invention, it will be apparent to those skilled in the art that changes and modifications may be made without departing from the invention in its broader aspects. For example, while the devices have been generally illustrated in rectilinear geometries, it will be understood that circular, cylindrical and other geometries may be used. Also, while the control regions of the device have been disclosed as N-type conductivity, P-type conductivity control regions could be used with devices on which the conductivity type of the various regions is reversed to that described. It is, therefore, intended that the appended claims cover all such changes and modifications as fall within the true spirit and scope of the invention.

I claim:

1. A semiconductor device comprising a body of semiconductor material including four layers of one and the opposite conductivity type, layers of one conductivity type being interleaved with layers of the opposite conductivity type forming a plurality of P-N junctions therein, an electrode in low resistance ohmic contact with an external layer of said body, means for providing a low impedance conductive path from said one electrode to an adjacent intermediate layer of opposite conductivity type, another electrode in low resistance ohmic contact with a surface of the other external layer of said body, a zone of said one conductivity type in said adjacent intermediate layer of opposite conductivity type, and a third electrode connected to said zone *in said adjacent intermediate layer* of opposite conductivity type.

2. A semiconductor device comprising a body of semiconductor material including four layers of one and the opposite conductivity type, layers of one conductivity type being interleaved with layers of the opposite conductivity type forming therewith a plurality of large area P-N junctions therein, a large area electrode in low resistance ohmic contact with an external layer of said body, means providing a low impedance conductive path from said one electrode to an adjacent intermediate layer of opposite conductivity type, another electrode in low resistance large area ohmic contact with a surface of the other external layer of said body, a zone of said one conductivity type in said adjacent intermediate layer of opposite conductivity type forming a P-N junction of small extent therewith, and a third electrode connected to said zone *in said adjacent intermediate layer* of opposite conductivity type.

3. A semiconductor device comprising a body of semiconductor material including four layers of one and the opposite conductivity type, layers of one conductivity type being interleaved with layers of the opposite conductivity type forming a plurality of P-N junctions therein, an electrode in low resistance ohmic contact with a surface of an external layer of said body and an exposed surface of an adjacent intermediate layer, another electrode in low resistance ohmic contact with a surface of the other external layer of said body, a zone of said one conductivity type in said adjacent intermediate layer, and a third electrode connected to said zone *in said adjacent intermediate layer* of opposite conductivity type.

4. A semiconductor device comprising a body of semiconductor material including four layers of one and the opposite conductivity type, layers of one conductivity type being interleaved with layers of the opposite conductivity type forming a plurality of large area P-N junctions therein, an electrode in low resistance ohmic contact of large extent with a surface of an external layer of said body and an exposed surface of an adjacent intermediate layer, and another electrode in low resistance ohmic contact of large extent with a surface of the other external layer of said body, a zone of said one conductivity type in said adjacent intermediate layer of opposite conductivity type forming a P-N junction of small extent therewith, a third electrode connected to said zone *in said adjacent intermediate layer* of opposite conductivity type.

5. A semiconductor device comprising a body of semiconductor material including four layers of one and the opposite conductivity type, layers of one conductivity type being interleaved with layers of the opposite conductivity type forming a plurality of P-N junctions therein, an electrode in low resistance ohmic contact with a surface of an external layer of said body and an exposed surface of an adjacent intermediate layer, and another electrode in low resistance ohmic contact with a surface of the other external layer of said body and an exposed surface of an adjacent intermediate layer, and a third electrode connected to one of said intermediate layers making an injecting contact therewith.

6. A semiconductor device comprising a body of semiconductor material including five layers of one and the opposite conductivity type, layers of one conductivity type being interleaved with layers of the opposite conductivity type forming a plurality of P-N junctions therein, an electrode in low resistance ohmic contact with a surface of an external layer of said body and an exposed surface of an adjacent intermediate layer, and another electrode in low resistance ohmic contact with a surface of the other external layer of said body and an exposed surface of an adjacent intermediate layer, and a third electrode connected to one of said intermediate layers adjacent an external layer making a rectifying contact therewith.

7. A semiconductor device comprising a body of semiconductor material including a region of one conductivity type having therein a zone of the opposite conductivity type to form therewith a first P–N junction, an electrode in low resistance ohmic contact with said zone, means for providing a low impedance conductive path from said one electrode to said region, a third region of said opposite conductivity type forming with said one [P–N junction] *region* a second P–N junction, said third region forming a junction transistor with said second P–N junction acting as the collector P–N junction thereof, a fourth region forming with said third region an injecting junction, said fourth, third and said one region forming a transistor with said second junction acting as the collector P–N junction thereof, another electrode secured to said body in conductive relation with said fourth region of one conductivity type, another zone in said body of opposite conductivity type, a third electrode connected to said other zone of opposite conductivity type, said other zone with said *one* [second] and third regions forming a transistor with said second P–N junction being the collector P–N junction thereof.

8. A semiconductor device comprising a body of semiconductor material including a first region of one conductivity type having therein a zone of the opposite conductivity type to form therewith a first large area P–N junction, an electrode in low resistance ohmic contact with said zone, means for providing a low impedance conductive path from said one electrode to said region, [the] *a* third region of said opposite conductivity type forming with said one region a second P–N junction, said third region, said [second region] *zone* and said first region forming a junction transistor with said second P–N junction acting as the collector P–N junction thereof, a fourth region of said one conductivity type forming with said third region a third P–N junction, said fourth, third and said one [junction] *region* forming a transistor with said second P–N junction acting as the collector P–N junction thereof, another electrode secured to said body in conductive relation with said fourth region of one conductivity type, another zone of opposite conductivity type in said first region of one conductivity type to form therewith a small area P–N junction, a third electrode connected to said other zone of opposite conductivity type, said *other* zone, said first region and said third region forming a transistor in which said second [collector] P–N junction acts as the collector P–N junction thereof.

9. A semiconductor device comprising a body of semiconductor material including four layers of one and the opposite conductivity type, layers of one conductivity type being interleaved with layers of the opposite conductivity type forming a plurality of P–N junctions therein, an electrode in low resistance ohmic contact with an external layer of said body, said external layer and an adjacent intermediate layer being constituted to form a P–N junction becoming conductive in the inverse direction at low voltages, another electrode in low resistance ohmic contact with a surface of the other external layer of said body, a zone of said one conductivity type in said adjacent intermediate layer of opposite conductivity type, and a third electrode connected to said zone *in said adjacent intermediate layer* of opposite conductivity type.

10. A semiconductor device comprising a body of semiconductor material including four layers of one and the opposite conductivity type between two faces of said body, layers of one conductivity type being interleaved with layers of the opposite conductivity type forming a plurality of P–N junctions therein, an adjacent intermediate layer surrounding an end layer to define therewith a common surface in one of said faces, an electrode in contact with said one adjacent layer and said one end layer in said surface, another end layer having a surface forming the other face of said body, another electrode in ohmic contact with said other face of said body, a zone of said one conductivity type in said adjacent intermediate layer, and a third contact to said zone.

11. A semiconductor device comprising a body of semiconductor material including four layers of one and the opposite conductivity type between two faces of said body, layers of one conductivity type being interleaved with layers of the opposite conductivity type forming a plurality of P–N junctions therein, an end layer of said one conductivity type and an intermediate layer of said opposite conductivity type being disposed to define a common surface in one of said faces, an electrode in ohmic contact with said one end layer and said one adjacent intermediate layer in said surface, another end layer of said body having a surface defining the other face thereof, another electrode in low resistance ohmic contact with said other face of said body, a minority carrier injecting contact to said adjacent intermediate layer of said opposite type conductively remote from said one electrode.

References Cited

The following references, cited by the Examiner, are of record in the patented file of this patent or the original patent.

UNITED STATES PATENTS

| | | | |
|---|---|---|---|
| 2,875,505 | 3/1959 | Pfann | 317—235 |
| 2,939,056 | 5/1960 | Muller | 317—235 |
| 2,980,810 | 4/1961 | Goldey | 317—235 |
| 2,985,804 | 5/1961 | Buie | 317—235 |
| 2,993,154 | 7/1961 | Goldey | 317—235 |

OTHER REFERENCES

Bulletin D420-02-8-59, p. 14, Solid State Products, Inc., Salem, Mass.

JOHN W. HUCKERT, Primary Examiner

B. ESTRIN, Assistant Examiner

U.S. Cl. X.R.

317—234; 148—177